United States Patent
Chung et al.

(10) Patent No.: US 10,861,622 B2
(45) Date of Patent: Dec. 8, 2020

(54) HIGH-SPEED CABLE ASSEMBLY

(71) Applicant: Tesla, Inc., Palo Alto, CA (US)

(72) Inventors: In Jae Chung, San Jose, CA (US); Adnan Esmail, Palo Alto, CA (US); Lukas Josef Pankau, Palo Alto, CA (US); Lakshya Jain, Mountain View, CA (US); Brijesh Tripathi, Los Altos, CA (US)

(73) Assignee: Tesla, Inc., Palo Alto, CA (US)

( * ) Notice: Subject to any disclaimer, the term of this patent is extended or adjusted under 35 U.S.C. 154(b) by 0 days.

(21) Appl. No.: 16/230,725

(22) Filed: Dec. 21, 2018

(65) Prior Publication Data

US 2019/0214164 A1 Jul. 11, 2019

Related U.S. Application Data

(60) Provisional application No. 62/614,110, filed on Jan. 5, 2018.

(51) Int. Cl.
| | |
|---|---|
| *H01B 11/10* | (2006.01) |
| *H01R 24/28* | (2011.01) |
| *H05K 9/00* | (2006.01) |
| *H01R 24/20* | (2011.01) |
| *H01B 7/08* | (2006.01) |
| *H01R 107/00* | (2006.01) |
| *H01R 13/6471* | (2011.01) |

(52) U.S. Cl.
CPC ....... *H01B 11/1091* (2013.01); *H01B 7/0823* (2013.01); *H01R 24/20* (2013.01); *H01R 24/28* (2013.01); *H05K 9/0088* (2013.01); *H05K 9/0098* (2013.01); *H01R 13/6471* (2013.01); *H01R 2107/00* (2013.01)

(58) Field of Classification Search
CPC .. H01B 7/0807; H01B 7/0823; H01B 7/0838; H01B 7/0846; H01B 7/0861; H01B 7/0876
See application file for complete search history.

(56) References Cited

U.S. PATENT DOCUMENTS

| | | | | |
|---|---|---|---|---|
| 5,097,099 A | * | 3/1992 | Miller ................. | H01B 7/0861 174/115 |
| 5,342,991 A | * | 8/1994 | Xu ....................... | H01B 7/0823 174/115 |
| 5,428,187 A | * | 6/1995 | Crane .................. | H01B 7/0861 174/115 |
| 5,461,370 A | | 10/1995 | Igarashi | |
| 6,403,887 B1 | * | 6/2002 | Kebabjian ............ | H01B 11/002 174/110 R |

(Continued)

FOREIGN PATENT DOCUMENTS

EP 0 305 058 3/1989

*Primary Examiner* — Ross N Gushi
(74) *Attorney, Agent, or Firm* — Knobbe, Martens, Olson & Bear, LLP

(57) ABSTRACT

A cable includes a plurality of differential conductors and a plurality of drain conductors. The differential conductors and the drain conductors are arranged in the form of groups such that each group comprises a pair of differential conductors and a pair of drain conductors and defines a communication pathway for communicating signals. The cable includes a body formed around the plurality of differential conductors and the plurality of drain conductors.

48 Claims, 15 Drawing Sheets

(56) References Cited

U.S. PATENT DOCUMENTS

| | | | | |
|---|---|---|---|---|
| 6,528,731 B2* | 3/2003 | Murakami | | H01B 7/0861 |
| | | | | 174/117 F |
| 6,630,624 B2* | 10/2003 | Tsao | | H01B 7/0861 |
| | | | | 174/113 R |
| 6,740,808 B1* | 5/2004 | Chang | | H01B 7/0861 |
| | | | | 174/113 R |
| 6,746,255 B1* | 6/2004 | Lee | | H01R 13/504 |
| | | | | 439/108 |
| 6,803,518 B2* | 10/2004 | Chang | | H01B 11/002 |
| | | | | 174/113 R |
| 7,004,767 B2* | 2/2006 | Kim | | H01R 13/6585 |
| | | | | 439/607.01 |
| 7,086,888 B2* | 8/2006 | Wu | | H01R 24/60 |
| | | | | 439/108 |
| 7,261,585 B2* | 8/2007 | Yamanashi | | H01R 4/242 |
| | | | | 439/404 |
| 9,172,149 B2* | 10/2015 | Xing | | H01R 9/035 |
| 9,508,467 B2* | 11/2016 | Pon | | H01B 9/003 |
| 9,697,926 B2* | 7/2017 | Huang | | H01B 7/0823 |
| 9,966,165 B2* | 5/2018 | Gross | | H01B 7/0861 |
| 10,096,952 B1 | 10/2018 | Silver | | |
| 10,147,515 B2* | 12/2018 | Chin | | H01B 11/203 |
| 10,586,632 B2 | 3/2020 | Esmail et al. | | |
| 2002/0046870 A1 | 4/2002 | Zein | | |
| 2003/0121694 A1* | 7/2003 | Grogl | | H01B 3/441 |
| | | | | 174/113 R |
| 2008/0250632 A1 | 10/2008 | Dayton | | |
| 2011/0232938 A1 | 9/2011 | Kodama | | |
| 2012/0111602 A1* | 5/2012 | Wei | | H01B 7/0861 |
| | | | | 174/114 R |
| 2014/0187080 A1 | 7/2014 | Holland | | |
| 2016/0351302 A1* | 12/2016 | Gundel | | H01B 7/0861 |
| 2017/0069991 A1 | 3/2017 | Hombo | | |
| 2017/0080929 A1 | 3/2017 | Sawamoto | | |
| 2017/0207549 A1 | 7/2017 | Chang | | |
| 2018/0301247 A1* | 10/2018 | Kobayashi | | H01B 11/203 |
| 2019/0043641 A1* | 2/2019 | Chen | | H01B 11/00 |
| 2019/0217794 A1 | 7/2019 | Chandra et al. | | |
| 2019/0248310 A1 | 8/2019 | Esmail et al. | | |

\* cited by examiner

HIGH-SPEED CABLE ASSEMBLY

CROSS REFERENCE TO RELATED PATENTS

The present U.S. Utility Patent Application claims priority pursuant to 35 U.S.C. § 119(e) to U.S. Provisional Application No. 62/614,110, entitled "HIGH-SPEED CABLE ASSEMBLY", filed 5 Jan. 2018, which is hereby incorporated herein by reference in its entirety and made part of the present U.S. Utility Patent Application for all purposes.

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not applicable.

BACKGROUND

Technical Field

The present disclosure relates to a cable assembly. More particularly, the present disclosure relates to a cable assembly that contains multiple collinear wires or conductors grouped together to provide communication pathways for communicating signals between various electrical components inside a vehicle, particularly at high data rates.

Description of Related Art

Traditional car wiring for vehicles include a plurality of cables for communicating power signals or data signals from one end to another. Such cables may be used for high-speed communications inside a vehicle for delivery of audio, video, or safety information, along with transmitting power that can be used to power sensors or other devices. Due to the advancement of controls and the sensors being installed in vehicles, data transfer rates have exceeded the capacity of simple twisted cables (or coaxial cables). High data rate devices such as video cameras or radar sensors may be deployed at the exterior of a vehicle while the high speed data they create needs to be sent elsewhere in the vehicle for processing or display. Traditional cable designs are unable to support the increased demand for data usage and high-speed communications inside the vehicle and there is a constant need for improving the designs of the cables to handle high data rates, for example, up to several gigabits per second (Gbps). Also, traditional cables only contain enough conductors to allow for signal transmission along a single path. Further, as the number of electronic modules increases, the complexity and cost associated with the cables becomes excessive. In addition, failures in wires or conductors of large cable assemblies can be difficult to isolate and costly to repair.

Hence, there is a need for a cable that overcomes the aforementioned drawbacks.

Figure 1A:
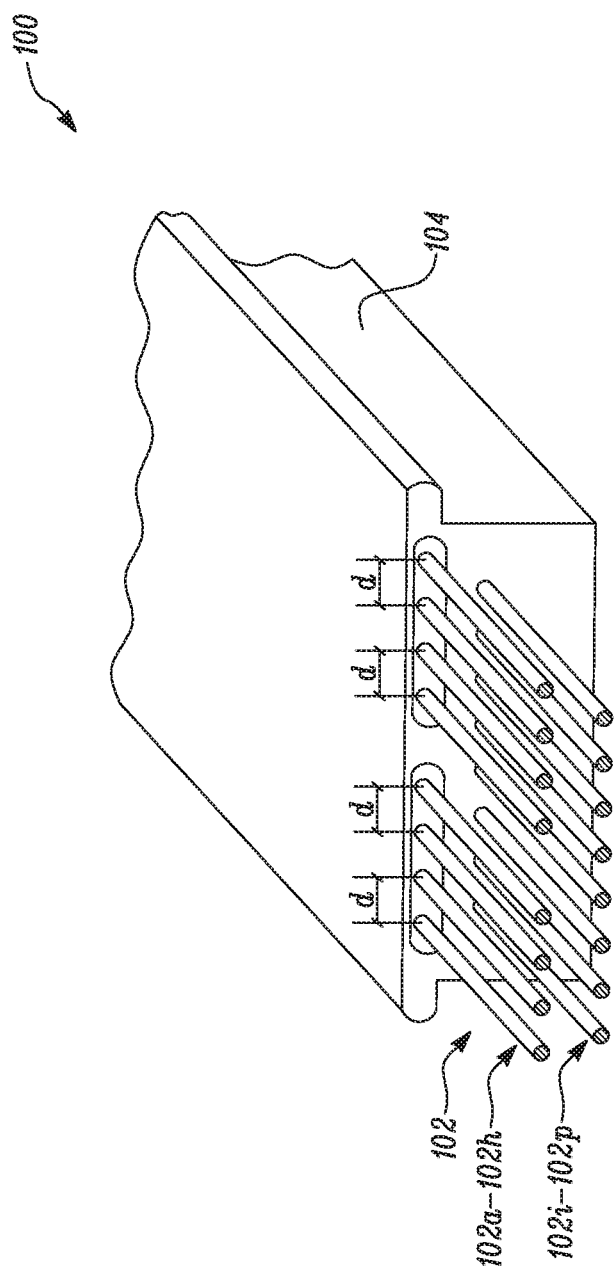
FIG. 1A illustrates a perspective-sectional view of a cable showing a body with multiple conductors according to certain embodiments of the current disclosure.

Embodiments of the present disclosure and their advantages are best understood by referring to the detailed description that follows. It should be appreciated that like reference numerals are used to identify like elements illustrated in one or more of the figures, wherein showings therein are for purposes of illustrating embodiments of the present disclosure and not for purposes of limiting the same.

DETAILED DESCRIPTION OF THE DISCLOSURE

The present disclosure relates to a cable configured to transmit high-speed data and power. It is particularly suited for use in a vehicle where space is limited and where fewer parts are desired because they can lead to decreased costs. More particularly, the present disclosure relates to a cable that contains multiple collinear wires or conductors grouped together that can provide multiple communication pathways for communicating signals between various components. Typically, multiple wires or conductors (or multiple wire bundles or conductor bundles) will be formed in a collinear orientation or otherwise have the ends fanned out into a collinear orientation (that is the wires or conductors may exist in different orientations throughout the bulk, but the ends will be collinear).

The cable according to the present disclosure allows high-speed communications of signals through the cable from one end to another. The cable supports high data rates of up to several Gbps. Further, the cable can be used to transmit signals in two, opposite directions. For example, when connecting sensors in a loop, redundant signal path can be created by transmitted communications and power in opposite directions. Thus, when a fault occurs, such as a break in the cable or a sensor fails, the redundant paths still allow for the transmission of signal and power up to the fault.

Reference will now be made in detail to specific aspects or features, examples of which are illustrated in the accompanying drawings. Wherever possible, corresponding or similar reference numbers will be used throughout the drawings to refer to the same or corresponding parts.

FIG. 1A illustrates a perspective sectional view of a cable 100. As shown, the cable 100 has eight collinear wires or conductors 102$a$-$h$ in a top layer and eight collinear wires or conductors 102$i$-$p$ in a bottom layer of the cable 100. However, in other embodiments, there may be fewer or greater than eight wires/conductors in the top layer and/or the bottom layer and the wires/conductors 102$a$-$h$, 102$i$-$p$ need not be collinear. Nonetheless, it is desirable to have the wire/conductor geometry set for ease of attachment of the end connectors (as discussed later). Further, the cable 100 may contain multiple wires/conductors disposed together (such as twisted wire/conductor pairs) instead of a single wire/conductor at the indicated locations. In other embodiments, multiple wires/conductors (for example, a pair of wires/conductors) may be coaxially wrapped. In other embodiments, multiple wires or conductors 102$a$-$h$, 102$i$-$p$ may be twisted together through the length of the cable 100 with the ends fanned out into a collinear orientation (that is the wires/conductors 102$a$-$h$, 102$i$-$p$ may exist in different orientations throughout the bulk, but the ends will be collinear).

According to embodiments of the current disclosure, the wires 102$a$-$h$, 102$i$-$p$ of the cable 100 may include wires/conductors that are configured for use in power transmission and/or wires/conductors that are configured for use in data transmission. In specific embodiments, one or more of the wires/conductors 102$a$-$h$, 102$i$-$p$ has an impedance between 40 and 50 Ohms, such as 45 Ohms.

Moreover, as shown in FIG. 1A, these wires/conductors 102$a$-$h$, 102$i$-$p$ in each layer are arranged in a flat (and collinear) configuration. Although such a collinear configuration is not necessary, it is desirable to arrange the wires/conductors in a set geometry so as to aid automation of, for example, the addition of connectors to the cable 100. FIG. 1A shows an example of this set geometry with each of the eight wires/conductors 102$a$-$h$, 102$i$-$p$ collinear and spaced by a distance 'd' between each pair of adjacently located wires/conductors. For example, the distance d' for wires/conductors 102$a$-102$b$ and wires/conductors 102$b$-102$c$ is equal. However, the wire-to-wire distances may be different in other embodiments.

An advantage of this cable configuration with known geometries and wires/conductors spaced at known dimensions (and preferably collinear) is that the process of connecting the flat wires/conductors 102$a$-$h$, 102$i$-$p$ to connectors may be automated through, for example crimping, traditional soldering, or laser soldering. In a specific implementation, encased wires are held on a flat conveyer or with a robotic arm, and the wires are stripped using a stripping attachment so as to preserve the wire spacing. The robotic arm (or another robotic arm) may then pick up a connector and crimp the connector to the wires by pressing down (or utilizing an appropriate tool). Alternatively, the known constant spacing of the wires 102$a$-$h$, 102$i$-$p$ may be used to reliably solder the wires to the connector, with the wires being connected to pins in the connector. Further, the spacing between the wires/conductors 102$a$-$h$, 102$i$-$p$ and/or between the pins (i.e., the pin pitch) may be varied, cable to cable and also within the same cable. For example, the spacing between the wires/conductors 102$a$-$h$, 102$i$-$p$ and/or pins within the connector may be varied to optimize signal integrity on high-frequency carriers and minimize space on power and low-frequency pins. It may also be used to control the impendence so as to remove or reduce the circuitry outside of the cable 100 (for example, on a printed circuit board connected to a receptacle). The pins may have a V shape or an open-triangle shape. In certain embodiments, instead of pins, thongs (i.e., metal fingers), pads, the wires/conductors themselves, a socket, or another connection method may be used to connect the cable 100 to a connector or another component.

Further, the cable 100 includes a body 104 that is formed around the wires/conductors 102$a$-$h$, 102$i$-$p$ as shown in FIG. 1A. The body 104 may have different geometries, including a flat geometry or an oval-shaped geometry. These and other cross-sections may be used to create non-uniform signal integrity characteristics (including impedance) of the wires/conductors 102$a$-$h$, 102$i$-$p$.

In certain embodiments, the structural integrity of the body 104 may vary along the length, or in any of the other dimensions. In certain embodiments, UV-light, heat treatment, or another technique may be used to alter the structure of the body 104. For example, UV-light may polymerize, further polymerize, cross link, further cross link, or otherwise increase the structural integrity of the body 104 in certain regions. In other embodiments, UV-light, ozone, heat treatment, aging, or another technique may be used to degrade the body 104 along the entire length, or in selective regions. This may be advantageous in instances when the structural integrity of the body 104 needs to change, for example, during removal after it has been connected in an automobile or to help route the cable around a structure that must be placed in a nearby vicinity.

The body 104 is preferentially made of a non-conducting material and may be a dielectric. For example, the body 104 may be made from a dielectric thermoplastic polymer, such as polyvinylidene fluoride (PVDF), a dielectric thermoplastic elastomer (TPE), such as polyurethane (PUR), ethylene propylene rubber (EPR), or another suitable polymer or material. The body 104 may also be formed of monomers (or shorter-chain polymers) that may be treated either during cable formation or after cable formation to alter the properties of the body 104. For example, ultraviolet light, a heat treatment, or application of a solvent, may cause additional polymerization in certain areas of the body 104 to alter the properties of the body 104, such as stiffness, yield strength, hydrophobicity, or another property. The body 104 may be formed through an extrusion process. The body 104 may also be formed through a lamination process. During lamination, wires/conductors 102$a$-$h$, 102$i$-$p$ and one or more layers of the non-conducting outer material of the body 104 may be added as layers, then hot pressed to form the cable 100.

In certain embodiments of the present disclosure, a thickness of the body 104 may be in the range of 0.1 millimeter to 10 centimeters. For example, the thickness of the body 104 may be 0.5 millimeter. In another example, the thickness of the body 104 may be 2 millimeters. Overall width of the cable 100 may be less than 12 millimeters. The body 104 may be extruded such that the cross section of body 104 varies throughout the length to impact different structural properties to the body 104, including varying stiffness and tensile strength. For example, the body 104 may be varying circular diameters, changing in diameter to impart different stiffness or other properties into the cable 100.

Figure 1B:
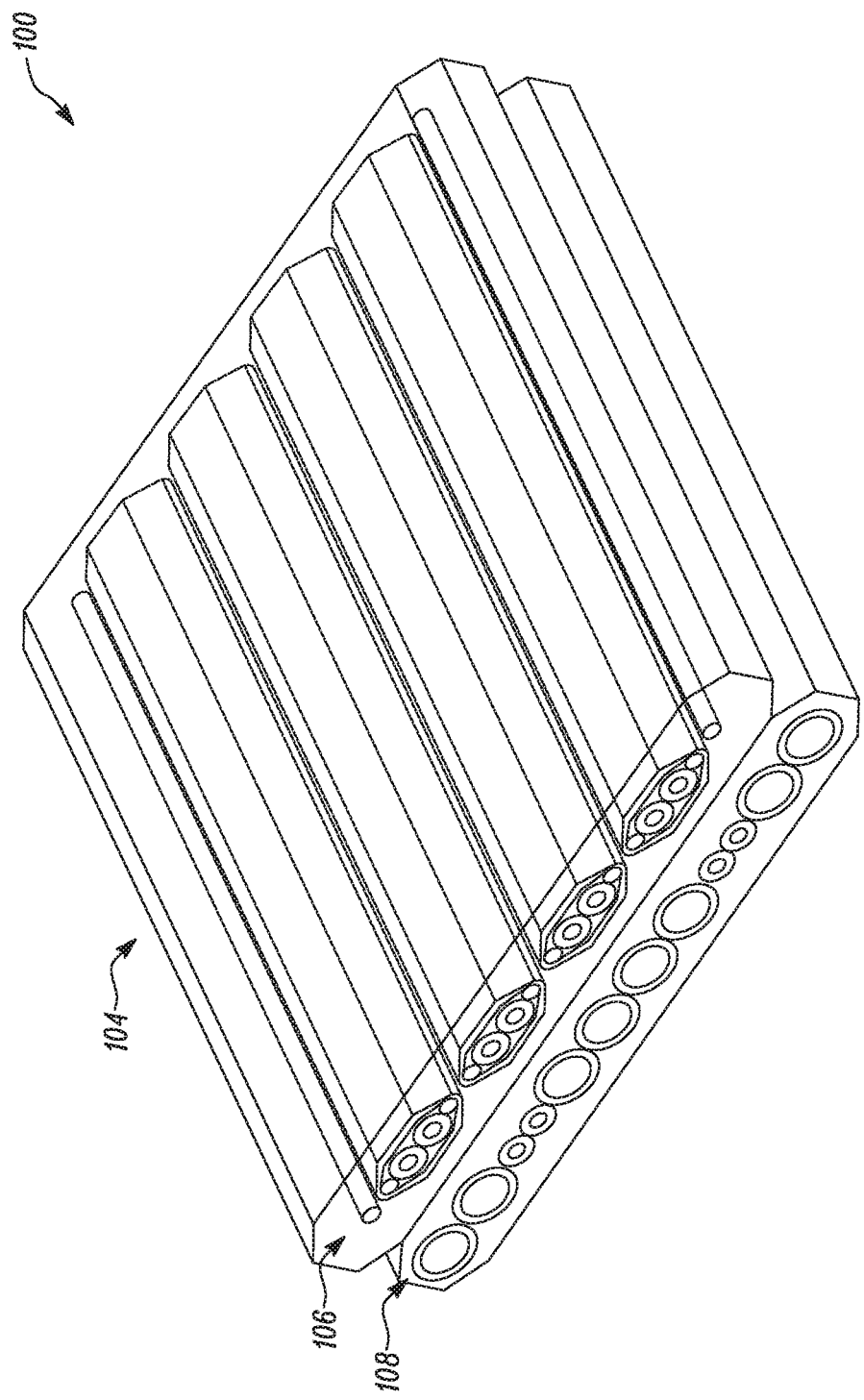
FIG. 1B illustrates a perspective-sectional view of a cable showing a body with multiple conductors according to certain embodiments of the current disclosure.

FIG. 1B illustrates a perspective sectional view of the cable 100 according to certain embodiments of the current disclosure. The cable 100 includes conductors 106 in a first layer and conductors 108 in a second layer. The first layer is disposed on top of the second layer. Both the sets of conductors 106, 108 are configured to carry signals related to communication of power and/or data across the cable 100. As shown, conductors 106 in the first layer includes four bundles of conductors (each bundle having four conductors) along with two extra conductors disposed on either side of the four bundles and conductors 108 in the second layer includes twelve conductors. As shown in FIG. 1B, conductors 106, 108 in each layer are arranged in a flat (and collinear) configuration. Although such a collinear configuration is not necessary, it is desirable to arrange the wires/conductors in a set geometry so as to aid automation of, for example, the addition of connectors to the cable 100. Further, the conductors 106, 108 may include conductors having different thickness depending on the type of signal they are carrying.

Figure 2A:
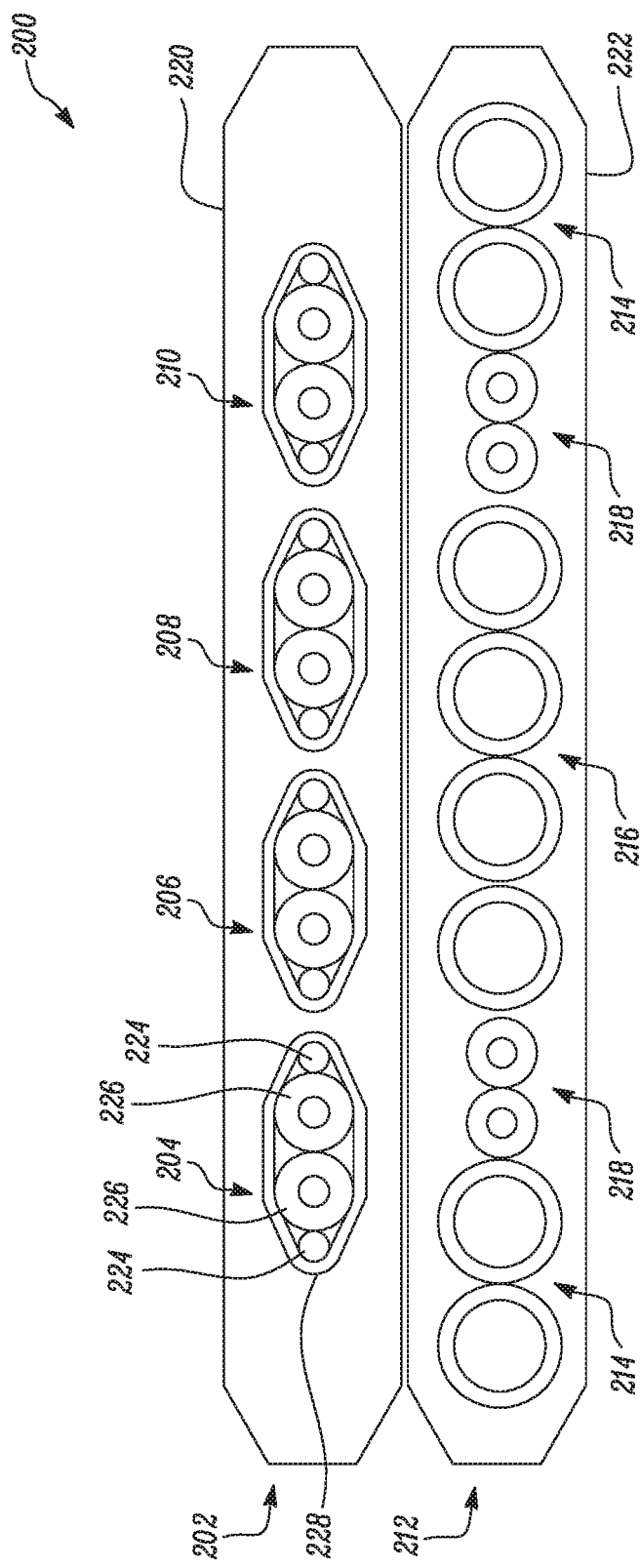
FIG. 2A illustrates a cross-sectional view of a cable assembly showing multiple sets of conductors according to certain embodiments of the current disclosure.

FIG. 2A illustrates a cross-sectional view of a cable assembly 200 showing multiple sets of conductors according to certain embodiments of the current disclosure. The cable assembly 200 includes a top layer 202 and a bottom layer 212 arranged such that an outer jacket 220 that enclosures the top layer 202 is seated on another outer jacket 222 that enclosures the bottom layer 212, making them two separate cables that are loosely coupled. Top layer 202 of the cable assembly 200 includes four sets of conductors 204, 206, 208, and 210. Bottom layer 212 of the cable assembly 200 includes power conductors 214, ground conductors 216, and secondary bus conductors 218.

The first set of conductors 204 in top layer 202 includes two drain conductors 224 and two differential conductors 226 (corresponding to positive and negative signals of the differential pair). The differential conductors 226 are used for high-speed communications. The first set of conductors 204 is wrapped around using a shield layer 228, preferentially of double-sided Aluminum and Mylar film having Al-Mylar-Al as a stack-up. In other embodiments, the shield layer 228 may be a single layer of aluminum. In the Al-Mylar-Al embodiment, the shield layer 228 may be formed by wrapping the film such that the externally facing aluminum surface touches the internally facing aluminum surface at every turn, to form a gap-less conductive enclosure throughout cable bulks. The aluminum-layer thickness and overlap ratios of adjacent turns may match the targets of common-mode emissions. The drain conductors 224 carry extraneous electrical noise to ground. The drain conductors 224 may complete an electrical circuit with the shield layer 228 thereby carrying extraneous electrical noise coupled to the shield layer 228 to ground.

Referring to the bottom layer 212, the power conductors 214 are provided at the left outmost and right outmost positions making two power domains that are spatially apart and electrically isolated. The ground conductors 216 and the secondary bus conductors 218 are provided in-between the two power conductors at left and two power conductors at right. This acts as a physical buffer between the two power domains and the fault conditions in one power domain are less likely to affect the other power domain.

The secondary bus conductors 218 may be used differentially for low-speed communications. In such usage, the positive and negative conductors of the secondary bus conductors 218 should reference each other differentially and their AC common-mode components should be conducted on the ground conductors 216.

Figure 2B:
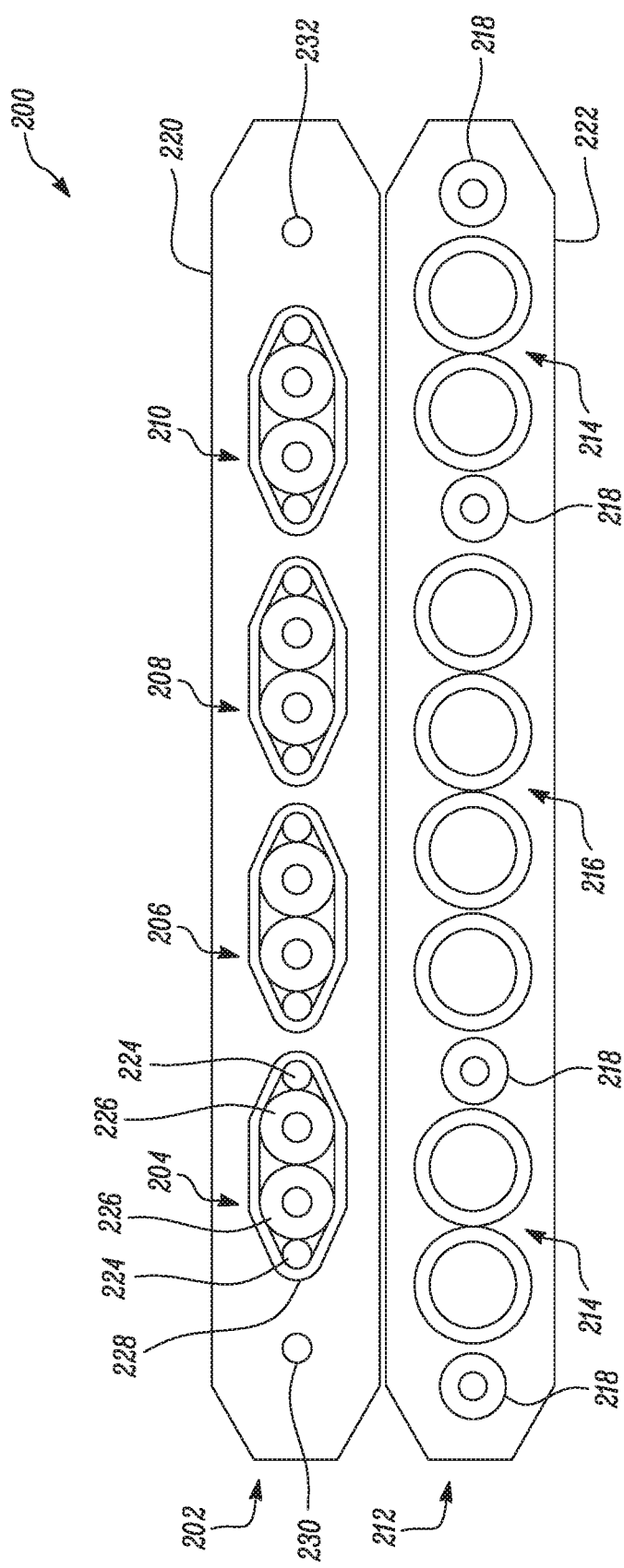
FIG. 2B illustrates a perspective-sectional view of the cable assembly showing multiple sets of conductors according to certain embodiments of the current disclosure.

FIG. 2B illustrates another cross-sectional view of the cable assembly 200 showing multiple sets of conductors according to certain embodiments of the current disclosure. In this embodiment, the top layer 202 of the cable assembly 200 includes drain conductors 230, 232 in addition to the four sets of conductors 204, 206, 208, and 210. The bottom layer 212 of the cable assembly includes a different configuration of power conductors 214, ground conductors 216, and secondary bus conductors 218 as compared to the configuration shown in FIG. 2A. Specifically, in the configuration of FIG. 2B, the secondary bus conductors 218 are disposed on either side of the power conductors 214.

In certain embodiments, the cable assemblies contain conductors sized for its respective lengths. For example, short-length segments of the cable have conductors with thinner wire gauges and longer segments have conductors with thicker wire gauges. As shown below, table 1 and table 2 list reference constructions for twin-ax based high speed cables and table 3 and table 4 show reference constructions for Shielded Twist Pair (STP) based high speed cables according to certain embodiments to the present disclosure.

TABLE 1

| Grouped length | Wire gauge | Plating material | Bulk construction | Solid or stranded |
|---|---|---|---|---|
| 0.5 meter | 34 | Tin | Twin-ax | Solid |
| 1.1 meter | 34 | Tin | Twin-ax | Solid |
| 1.9 meter | 32 | Tin | Twin-ax | Solid |
| 2.4 meter | 32 | Tin | Twin-ax | Solid |
| 3.0 meter | 30 | Tin | Twin-ax | Solid |

TABLE 2

| Grouped length | Wire gauge | Plating material | Bulk construction | Solid or stranded |
|---|---|---|---|---|
| 0.6 meter | 34 | Tin | Twin-ax | Solid |
| 1.2 meter | 34 | Tin | Twin-ax | Solid |
| 1.5 meter | 32 | Tin | Twin-ax | Solid |
| 1.8 meter | 32 | Tin | Twin-ax | Solid |
| 2.2 meter | 32 | Tin | Twin-ax | Solid |
| 2.6 meter | 32 | Tin | Twin-ax | Solid |
| 2.8 meter | 32 | Tin | Twin-ax | Solid |
| 3.5 meter | 30 | Tin | Twin-ax | Solid |
| 4.0 meter | 30 | Tin | Twin-ax | Solid |

TABLE 3

| Grouped length | Wire gauge | Plating material | Bulk construction | Solid or stranded |
|---|---|---|---|---|
| 0.5 meter | 34 | Tin | STP | Solid |
| 1.1 meter | 34 | Tin | STP | Solid |
| 1.9 meter | 30 | Tin | STP | Solid |

TABLE 3-continued

| Grouped length | Wire gauge | Plating material | Bulk construction | Solid or stranded |
|---|---|---|---|---|
| 2.4 meter | 28 | Tin | STP | Solid |
| 3.0 meter | 28 | Tin | STP | Solid |

TABLE 4

| Grouped length | Wire gauge | Plating material | Bulk construction | Solid or stranded |
|---|---|---|---|---|
| 0.6 meter | 34 | Tin | STP | Solid |
| 1.2 meter | 34 | Tin | STP | Solid |
| 1.5 meter | 32 | Tin | STP | Solid |
| 1.8 meter | 32 | Tin | STP | Solid |
| 2.2 meter | 30 | Tin | STP | Solid |
| 2.6 meter | 30 | Tin | STP | Solid |
| 2.8 meter | 30 | Tin | STP | Solid |
| 3.5 meter | 28 | Tin | STP | Solid |
| 4.0 meter | 28 | Tin | STP | Solid |

Figure 3:
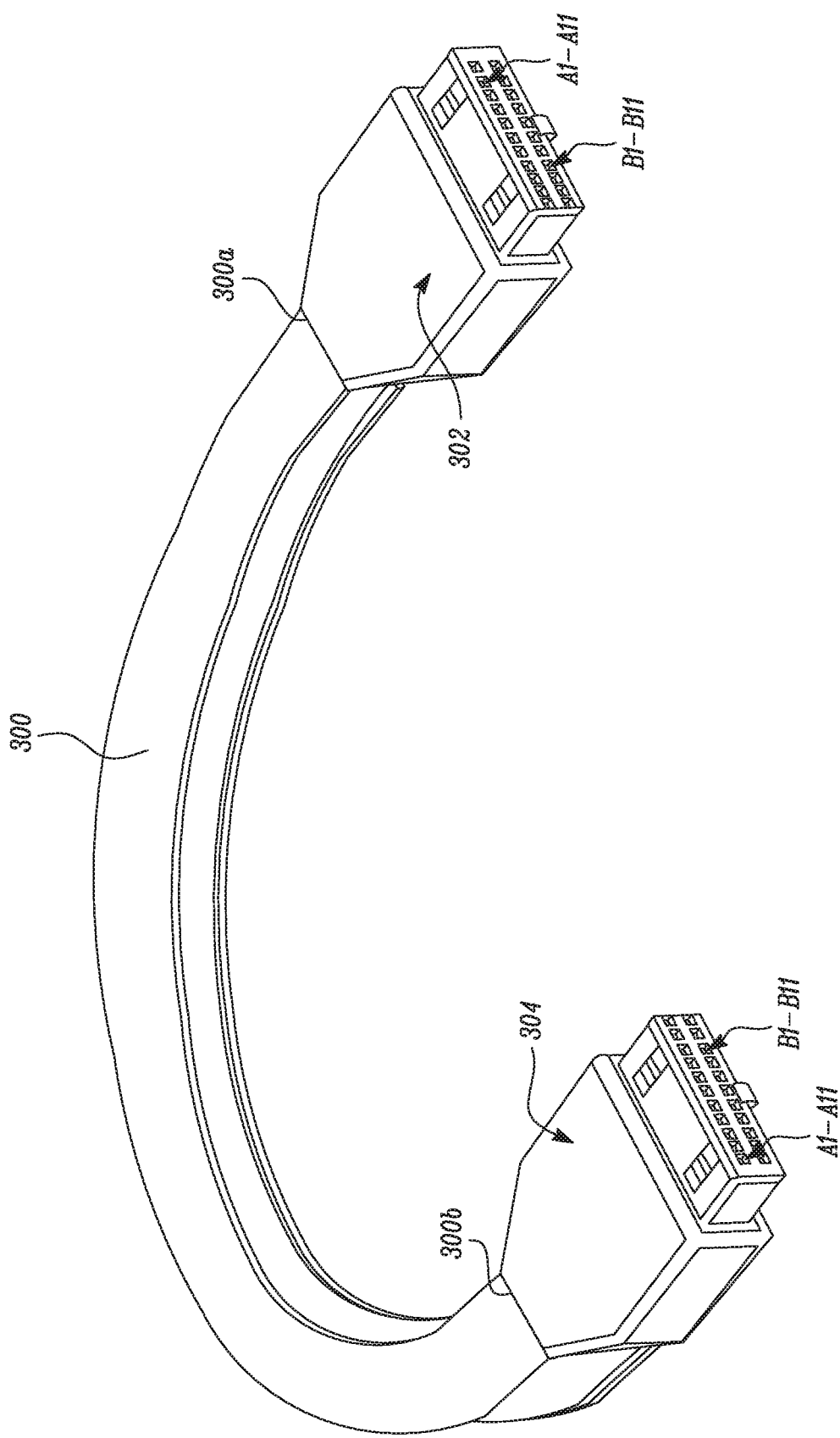
FIG. 3 illustrates the cable showing a pair of connectors disposed at ends of the cable and showing multiple pins disposed within each of the connectors according to certain embodiments of the current disclosure.

FIG. 3 illustrates a perspective view of a cable 300 showing a pair of connectors 302, 304 disposed at ends 300a, 300b of the cable 300 according to an example embodiment of the current disclosure. As shown, a first and second connectors 302, 304 includes multiple pins therein. As shown in FIG. 3, the pins associated with the first connector 302 and the pins associated with the second connector 304 have been arranged linearly within respective ones of the first and second connectors 302, 304. For instance, a first row and a second row, each having 11 pins (A1-A11 and B1-B11), is shown to be associated with the connector 302 while a first row and a second row, each having 11 pins (A1-A11 and B1-B11), is shown to be associated with the connector 304.

Although the pair of connectors 302, 304 are shown as female connectors, one or both of the connectors 302, 304 may be male connectors. Other connectors may be connected to the cable 300 such as a USB-C connector. Moreover, although each pin from the first and second connectors 302, 304 in FIG. 3 is shown to be similar to one another, in other embodiments, one or more pins of one connector may be dissimilar to corresponding pins of the other connector depending on various factors including, but not limited to, a type of wire/conductor that is used to connect with the one or more pins present in the connector, a function associated with the given wire/conductor i.e., data transmission or power transmission, and/or a type of port that is used to facilitate a connection with respective ones of the first and second connectors 302, 304. In certain embodiments, instead of pins, a connector may contain thongs (i.e., metal fingers), pads, the wires/conductors themselves, a socket, or another connection structure.

In certain embodiments, each of high-speed differential pairs meet or exceed the differential insertion loss, normalized based on 90-Ohm differential as shown in Table 5.

TABLE 5

| | Frequency | | | | |
|---|---|---|---|---|---|
| | 0.1 GHz | 2.5 GHz | 5 GHz | 10 GHz | 15 GHz |
| Insertion loss limit | −0.25 dB | −0.40 dB | −0.60 dB | −1.2 dB | −2.0 dB |

In certain embodiments, each of high-speed differential pairs meet or exceed the differential return loss, normalized based on 90-Ohm differential as shown in Table 6.

TABLE 6

| | Frequency | | | | |
|---|---|---|---|---|---|
| | 0.1 GHz | 2.5 GHz | 5 GHz | 10 GHz | 15 GHz |
| Return loss Limit | −20 dB | −18 dB | −18 dB | −13 dB | −6 dB |

In certain embodiments, each of high-speed differential pairs meet or exceed the through mode-conversion loss (SCD21, differential to common mode conversion), normalized based on 90-Ohm differential as shown in Table 7.

TABLE 7

| | Frequency | | | | |
|---|---|---|---|---|---|
| | 0.1 GHz | 2.5 GHz | 6 GHz | 10 GHz | 15 GHz |
| SCD21 (thru) limit | −28 dB | −24 dB | −24 dB | −20 dB | −20 dB |

In certain embodiments, near-end crosstalk between any two pairs of opposite directions meet or exceed the differential crosstalk limit, normalized based on 90-Ohm differential as shown in Table 8.

TABLE 8

| | Frequency | | | | |
|---|---|---|---|---|---|
| | 0.1 GHz | 2.5 GHz | 5 GHz | 10 GHz | 15 GHz |
| Crosstalk limit | −36 dB | −36 dB | −36 dB | −30 dB | −24 dB |

In certain embodiments, far-end crosstalk between two pairs of the same direction meet or exceed the differential crosstalk limit, normalized based on 90-Ohm differential as shown in table 9.

TABLE 9

| | Frequency | | | | |
|---|---|---|---|---|---|
| | 0.1 GHz | 2.5 GHz | 5 GHz | 10 GHz | 15 GHz |
| Crosstalk limit | −36 dB | −34 dB | −30 dB | −24 dB | −24 dB |

In embodiments, when connectors are properly mated, the connectors and the cable meet IP65/IP6K9K dust and water proof compliance. In certain embodiments, the connectors and the cable meet or exceed IPX4 rating in accordance with IEC standard 60529. That is, the connectors and the cable can preferentially withstand accidental splash of water. In certain embodiments, the connectors and the cable meet a higher rating, such as IPX7 which indicates withstanding accidental immersion in one meter of water for up to thirty minutes. A rim structure, one or more O-rings, a liquid gasket, cure-in-place, or form-in-place gasket or face seal, or another structure may be used to achieve the IPX4 or above rating. In other embodiments, the connectors and the cable are IPX8 rated for continuous underwater use.

Further, in other embodiments, the cable 100 with mated connectors, and conductor terminations preferentially tolerate profiles of thermal cycle and static thermal stress according to USCAR-21 Revision 3 specification. If transient electrical discontinuity occurs, the time duration does not exceed more than 1 μs and the DC resistance during the excursion is not higher than the maximum DC resistance specified in Table 12.

Compliance limits of thermal shock resistance and vibration resistance is particularly important for automobile applications since large temperature may result from through ambient temperature fluctuations and through operation (for example, heat generated during electric vehicle battery discharge or motor operation).

In certain embodiments, the cable 100 with mated conductors, and conductor terminations preferably tolerate a vibration resistance according to USCAR-2 Revision 6 specification. The cable 100 with mated conductors, and conductor terminations also tolerates mechanical shocks produced by potholes or something equivalent. The cable 100 maintains the quality contacts during and at the end of the following two tests: 1) 400 cycles of 12G peak half-sine accelerations for 20 ms in each of the 6 directions (i.e. positive and negative directions of x, y, and z axis's), and 2) 10 cycles of 35G peak half-sine acceleration for 10 ms in the same 6 directions. If transient electrical discontinuity occurs during random vibrations and/or mechanical shocks, the time duration does not exceed more than 1 μs and the DC resistance during the excursion is not higher than the maximum DC resistance specified in Table 12.

In certain embodiments, the mating of each connector 302/304 to the cable 300 has a lock and key mechanism (for example, a notch in the plug connector and a structure in the main cable structure that sits in the notch or vice versa) to allow only a single mating orientation between the plug connector and the cable structure. In certain embodiments, a mechanical feature such as a key or notch is made on the overmold area so that mating is possible only in one (normal) orientation. The notch once properly mated with a counter structure on the receptacle side complies to IPX4 water proof requirement. In other embodiments, it should comply IP65/IP6K9K dust and water proof requirements.

The mating preferably requires a force of 20N or less and 5N or more to be applied for the first 100 cycles and once mated, the mated plug connector and main cable structure preferably can withstand a pulling force of 200N or less and 75N or more for the first 100 cycles. However, more or less force may be required to mate the plug connector with the main cable structure. The cable 100 preferably withstands a pulling force of at least 75N, such that no physical damage occurs when a pulling force of at least 75N is applied for one minute and while clamping one end of the cable 100.

Figure 4A:
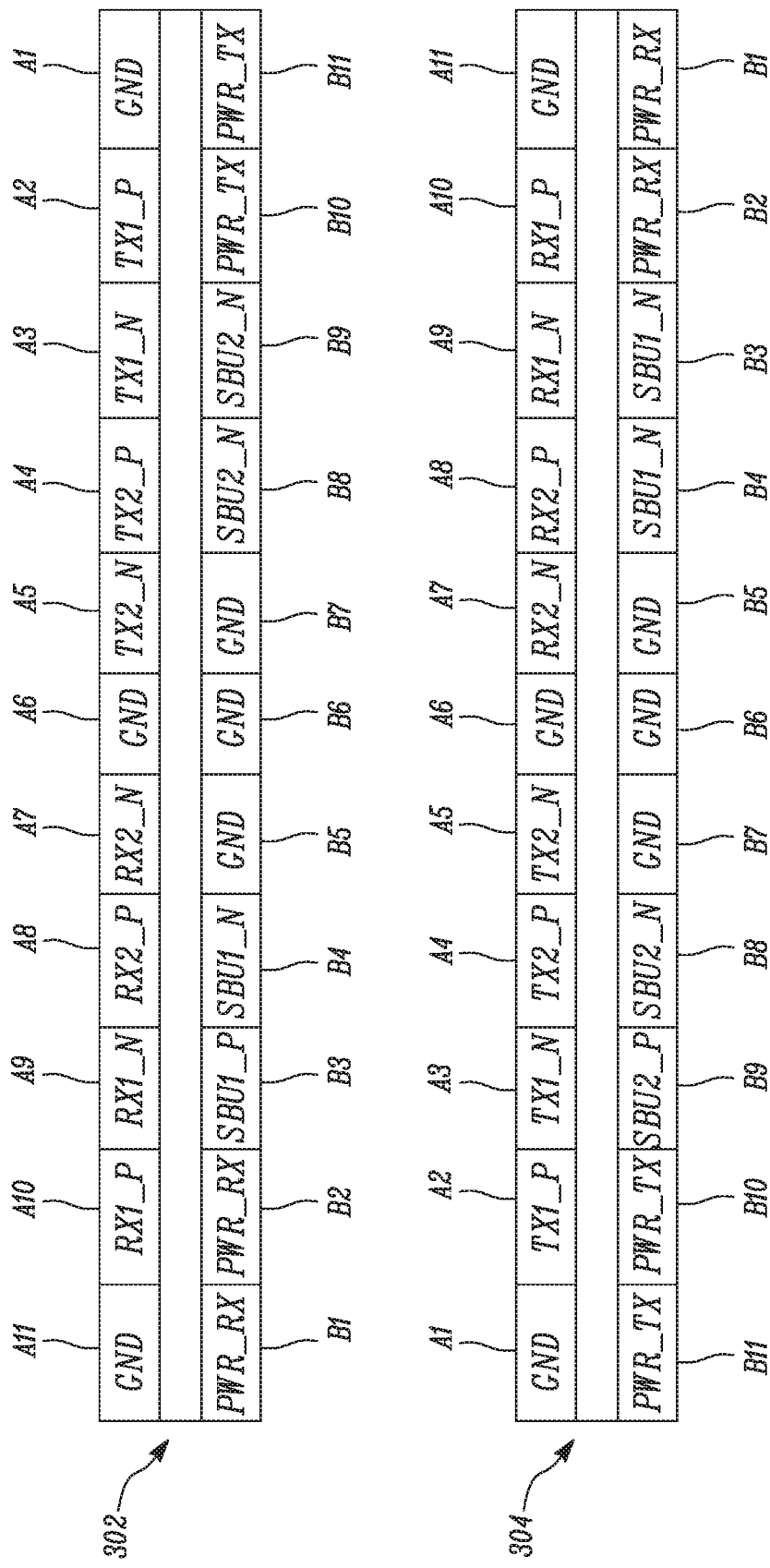
FIG. 4A is a cross-section schematic illustration of the connectors at the ends of the cable according to certain embodiments of the current disclosure.

FIG. 4A is a schematic of the pair of connectors 302, 304 according to certain embodiments of the current disclosure. As shown in FIG. 4A, one of the connectors, for instance, plug connector 302, has 22 pins, each of which may correspond to at least one conductor from the cable 300. In the illustrated embodiment of FIG. 4A, pins A1, A6, A11, B5, B6, and B7 of connector 302 are ground pins. These pins are connected to a ground conductor. Similarly, pins B1, B2, B10 and B11 of connector 302 are power pins that connect to a power conductor. At times, certain pins may be omitted. When pins are omitted, they may later be assigned and ultimately connected to conductors. The arrangement of pins may change depending on the specific connector and transmission requirements.

In certain embodiments, there are eleven conductors corresponding to pins A1 to A11 that connect to plug connector 302 and receptacle connector 304 with the pin configuration shown in FIG. 4A. The eleven conductors consist of four pairs of conductors for high-speed data transfer. These pairs are high-speed pairs that preferentially aggregate to at least 30 Gbps (raw) bandwidth for three-meter-cable length. Three conductors are ground conductors.

In certain embodiments, there are eleven conductors corresponding to pins B1 to B11 that connect to plug connector 302 and receptacle connector 304 with the pin configuration shown in FIG. 4A. The eleven conductors consist of two pairs of secondary bus conductors, which connect to the SBU1 and SBU2 pins (B3, B4 and B8, B9). These secondary bus conductors may be unshielded and singled ended. Two pairs are power conductors carry up to 1.5 A current delivery and have DC resistances. Three ground conductors are connected to pins B5, B6, and B7. Each of the conductors is preferably shielded and terminated into the connector through a metal shell on each end.

Figure 4B:
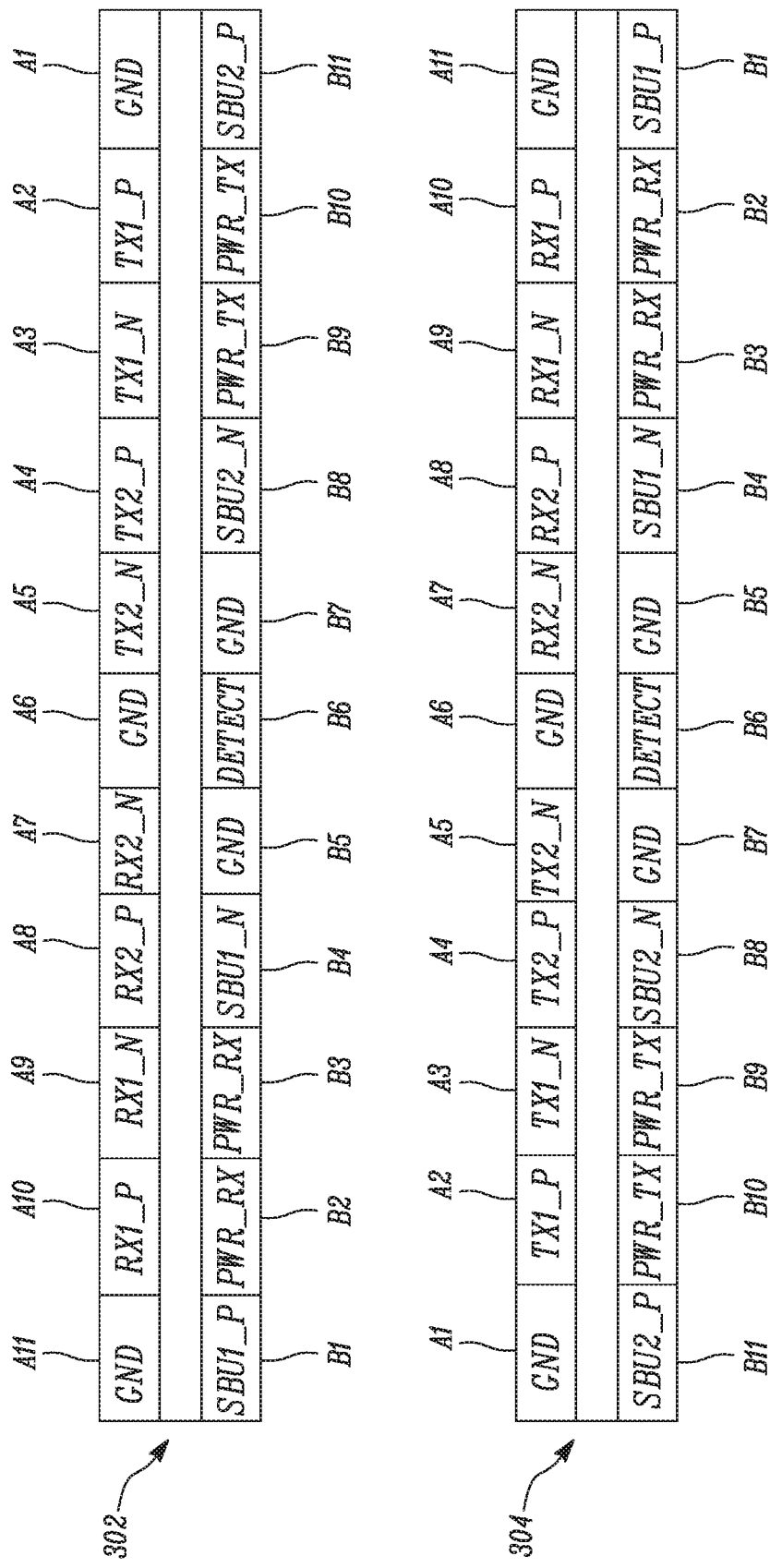
FIG. 4B is a cross-section schematic illustration of the connectors at the ends of the cable according to certain embodiments of the current disclosure.

FIG. 4B is a schematic of the pair of connectors 302, 304 according to certain embodiments of the current disclosure. In this embodiment, the configuration of pins A1-A11 for the connectors 304, 304 is same as the configuration in FIG. 4A. With respect to pins B1-B11 in this configuration, pins B2, B3, B9 and B10 of connectors 302, 304 are power pins that connect to a power conductor. Pins B2 and B3 of plug connector 302 correspond to PWR_RX pins which, when mated with corresponding receptacle pins, deliver power into the cable assembly from the power source where receptacle connector is seated. SBU1 and SBU2 pins B1, B4 and B8, B11 connect to two pairs of secondary bus conductors. Pins B5 and B7 are ground conductor pins. DETECT pin at B6 is defined to detect an event when plug connector is fully seated into receptacle connector, forming electrical contacts at all pins. DETECT pin is weakly pulled up high on the receptacle side until it mates with a plug-side pin. When a plugging event occurs, it is pulled down to ground. DETECT pin typically has the smallest size compared with the rest of pins to become the last pin to engage and the first pin to disengage.

In both of the pin configurations shown in FIGS. 4A and 4B, the pinout of receptacle connector 304 is the mirror image of the pinout of plug connector 302. TX1 high-speed pair of one connector maps to RX1 pair of the other connector, and TX2 pair to RX2 pair. Likewise, PWR_TX of one connector maps to PWR_RX of the other connector. SBU1 pair of one connector maps to SBU2 pair of the other connector. Drain conductors and ground conductors tied together on the plug board serve as return paths for both power and common-mode components of high-speed and low-speed signals. Specifically, the pins are mapped to conductors according to Table 10 in certain embodiments of the present disclosure. In other embodiment, the pins are mapped to conductors according to Table 11.

TABLE 10

| Plug #1 | | Cable Bulk | | Plug #2 | |
|---|---|---|---|---|---|
| Pin | Signal Name | Conductor Number | Conductor Name | Pin | Signal Name |
| A2 | TX1_P | 1 | HS1_P | A10 | RX1_P |
| A3 | TX1_N | 2 | HS1_N | A9 | RX1_N |
| A4 | TX2_P | 3 | HS2_P | A8 | RX2_P |
| A5 | TX2_N | 4 | HS2_N | A7 | RX2_N |
| A7 | RX2_N | 5 | HS3_N | A5 | TX2_N |
| A8 | RX2_P | 6 | HS3_P | A4 | TX2_P |
| A9 | RX1_N | 7 | HS4_N | A3 | TX1_N |
| A10 | RX1_P | 8 | HS4_P | A2 | TX1_P |
| B3 | SBU1_P | 9 | LS1_P | B9 | SBU2_P |
| B4 | SBU1_N | 10 | LS1_N | B8 | SBU2_N |
| B8 | SBU2_N | 11 | LS2_N | B4 | SBU1_N |

TABLE 10-continued

| Plug #1 | | Cable Bulk | | Plug #2 | |
|---|---|---|---|---|---|
| Pin | Signal Name | Conductor Number | Conductor Name | Pin | Signal Name |
| B9 | SBU2_P | 12 | LS2_P | B3 | SBU1_P |
| B10, B11 | PWR_TX | 13, 14 | PWR_A | B1, B2 | PWR_RX |
| B1, B2 | PWR_RX | 15, 16 | PWR_B | B10, B11 | PWR_TX |
| A1, A6, A11 B5, B6, B7 | GND | 17, 18, 19, 20 | GND | A1, A6, A11 B5, B6, B7 | GND |
| Plug shell | Conductor shield | NA | Conductor shield | Plug shell | NA |

TABLE 11

| Plug #1 | | Cable Bulk | | Plug #2 | |
|---|---|---|---|---|---|
| Pin | Signal Name | Conductor Number | Conductor Name | Pin | Signal Name |
| A2 | TX1_P | 1 | HS1_P | A10 | RX1_P |
| A3 | TX1_N | 2 | HS1_N | A9 | RX1_N |
| A4 | TX2_P | 3 | HS2_P | A8 | RX2_P |
| A5 | TX2_N | 4 | HS2_N | A7 | RX2_N |
| A7 | RX2_N | 5 | HS3_N | A5 | TX2_N |
| A8 | RX2_P | 6 | HS3_P | A4 | TX2_P |
| A9 | RX1_N | 7 | HS4_N | A3 | TX1_N |
| A10 | RX1_P | 8 | HS4_P | A2 | TX1_P |
| B1 | SBU1_P | 9 | LS1_P | B11 | SBU2_P |
| B4 | SBU1_N | 10 | LS1_N | B8 | SBU2_N |
| B8 | SBU2_N | 11 | LS2_N | B4 | SBU1_N |
| B11 | SBU2_P | 12 | LS2_P | B1 | SBU1_P |
| B9, B10 | PWR_TX | 13, 14 | PWR_A | B2, B3 | PWR_RX |
| B2, B3 | PWR_RX | 15, 16 | PWR_B | B9, B10 | PWR_TX |
| A1, A6, A11, B5, B7 | GND | 17, 18, 19, 20 | GND | A1, A6, A11, B5, B7 | GND |
| B6 | DETECT | NA | NA | B6 | DETECT |
| Plug shell | Ext drain | NA | Ext drain | NA | Plug shell |

In certain embodiments, the DC resistance for power and ground paths meet the requirements specified in Table 12 for both stationary mode and vibrational/thermal (i.e., drive) mode to ensure that the IR drop across the cable assembly is 1400 mV or less for a 4 A power delivery. Preferentially, the DC resistance in the vibrational/thermal mode is <=5 Ohm for each of high-speed signals, and <=10 Ohm for the SBU signals.

TABLE 12

| Signal name | Conductor number | DCR, Max in stationary mode | DCR, Max under vibrational/ thermal mode |
|---|---|---|---|
| HS1_P | 1 | 2.5 Ω | 5 Ω |
| HS1_N | 2 | 2.5 Ω | 5 Ω |
| HS2_P | 3 | 2.5 Ω | 5 Ω |
| HS2_N | 4 | 2.5 Ω | 5 Ω |
| HS3_N | 5 | 2.5 Ω | 5 Ω |
| HS3_P | 6 | 2.5 Ω | 5 Ω |
| HS4_N | 7 | 2.5 Ω | 5 Ω |
| HS4_P | 8 | 2.5 Ω | 5 Ω |
| LS1_P | 9 | 5.0 Ω | 10 Ω |
| LS1_N | 10 | 5.0 Ω | 10 Ω |
| LS2_N | 11 | 5.0 Ω | 10 Ω |
| LS2_P | 12 | 5.0 Ω | 10 Ω |
| PWR_TX | 13, 14 | 200 mΩ | 250 mΩ |
| PWR_RX | 15, 16 | 200 mΩ | 250 mΩ |
| GND | 17, 18, 19, 20 | 75 mΩ | 100 mΩ |
| Return path for a high-speed pair | | 750 mΩ | 1 Ω |

Figure 6A:
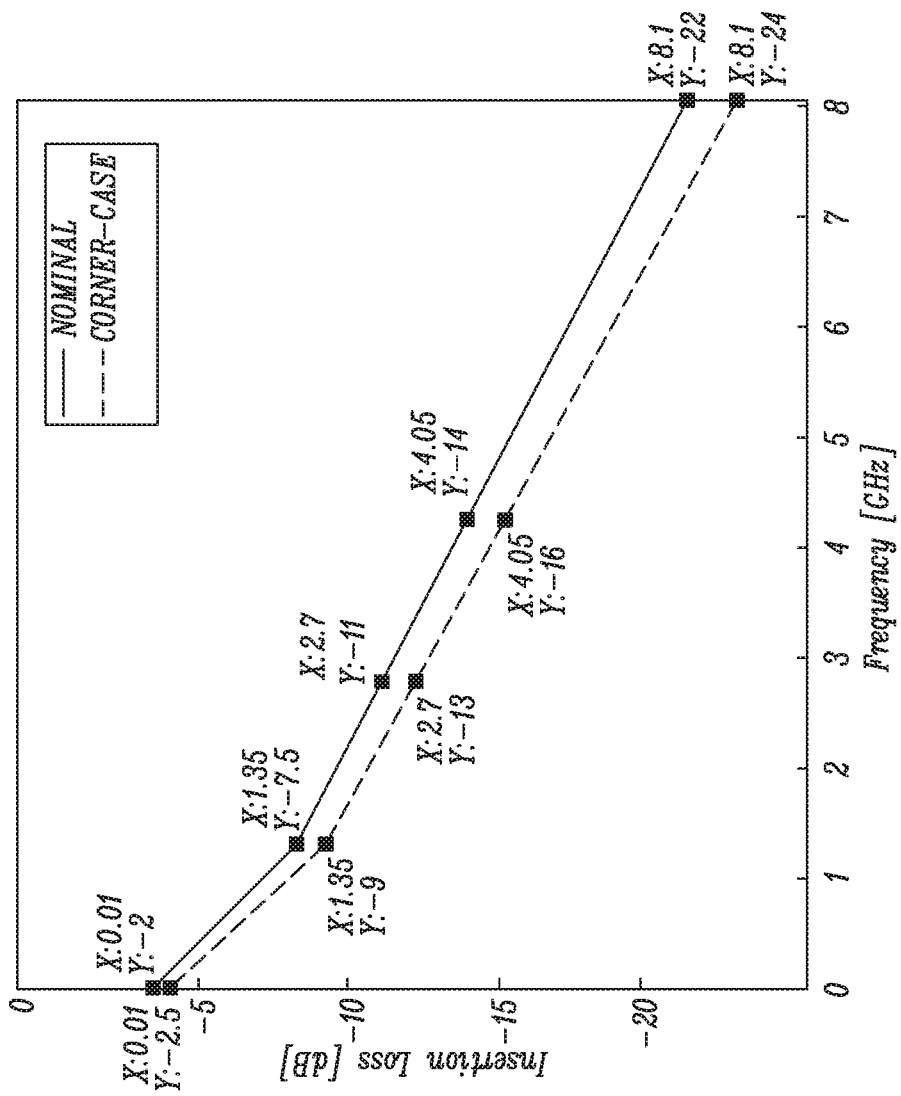
FIG. 6A is a plot of the maximum insertion loss experienced by the high-speed conductor pairs with reference normalized to 90-Ohm differential, according to certain embodiments of the current disclosure.

AC performances of cable assemblies are known to be de-rated at harsh environmental conditions, i.e. worse losses and impedance discontinuities when exposed to extreme humidity and/or extreme temperature compared to normal conditions. In embodiments, the cables disclosed herein meet both at nominal state and at corner-case states. In certain embodiments, the corner-case state is defined as a cable assembly, which has gone through 100 cycles of bending tests constrained to the minimum bending radius and been treated in a 100% humidity at 105° C. for 12 hours. In certain embodiments, as shown in FIG. 6A, all high-speed pairs meet or exceed the following insertion loss requirements with reference normalized to 90-Ohm, differential. As shown in FIG. 6A, the insertion loss at nominal state is no greater than 7.5 dB@1.35 GHz, 11 dB@2.7 GHz, and 14 dB@4.05 GHz, respectively. Insertion loss values at corner-case state are shown by dashed line in FIG. 6A. At corner-case state, the insertion loss is no greater than 9 dB@1.35 GHz, 13 dB@2.7 GHz, and 16 dB@4.05 GHz, respectively.

Figure 6B:
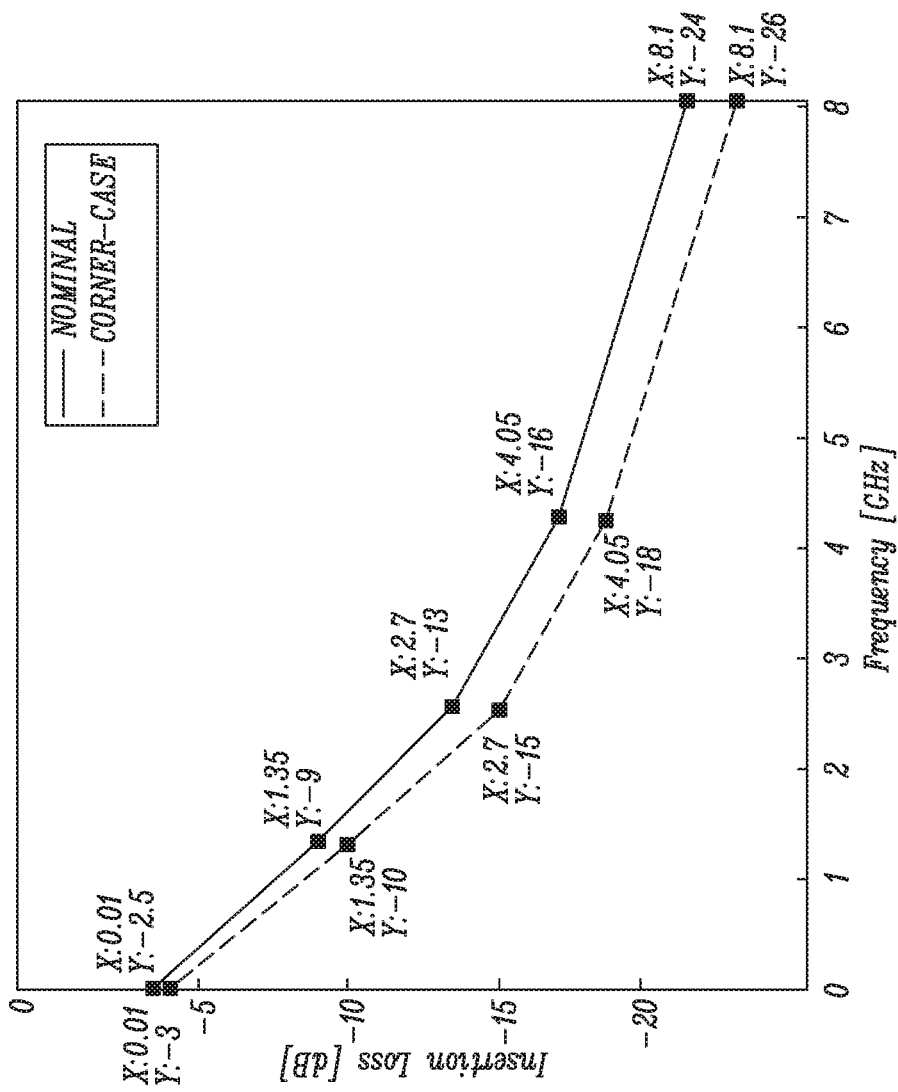
FIG. 6B is a plot of the maximum insertion loss experienced by the high-speed conductor pairs with reference normalized to 90-Ohm differential, according to certain embodiments of the current disclosure.

In other embodiments, as shown in FIG. 6B, the insertion loss at nominal state is no greater than 9 dB@1.35 GHz, 13 dB@2.7 GHz, and 16 dB@4.05 GHz, respectively. Insertion loss values at corner-case state are shown by dashed line in FIG. 6B. At corner-case state, the insertion loss is no greater than 10 dB@1.35 GHz, 15 dB@2.7 GHz, and 18 dB@4.05 GHz, respectively.

Figure 7:
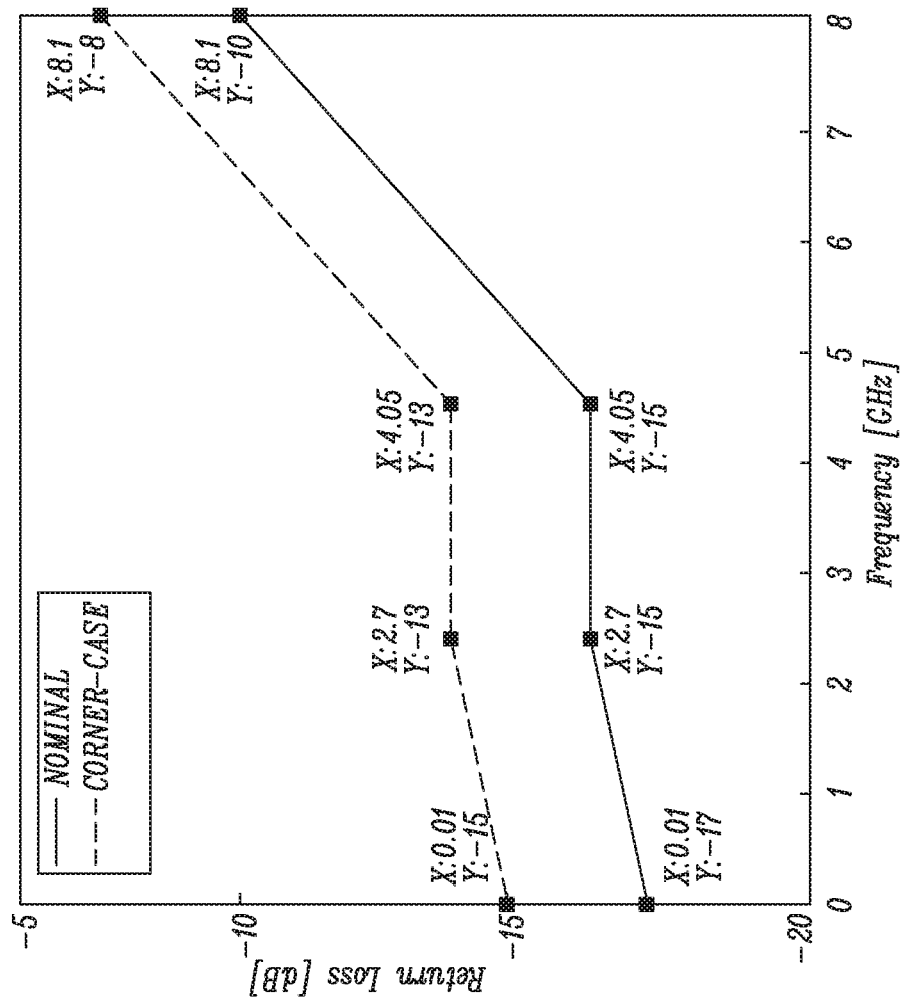
FIG. 7 is a plot of the maximum return loss experienced by the high-speed conductor pairs with reference normalized to 90-Ohm differential, according to certain embodiments of the current disclosure.

In certain embodiments, all high-speed pairs meet or exceed the return loss requirements shown in FIG. 7, with reference normalized to 90-Ohm, differential. As shown in the FIG. 7, the return loss at nominal state is no greater than 17 dB@0.01 GHz, 15 dB@2.7 GHz to 4.05 GHz, and 10 dB@8.1 GHz. Return loss values at corner-case state are shown by dashed line in FIG. 7. The return loss at corner-case state is no greater than 15 dB@0.01 GHz, 13 dB@2.7 GHz to 4.05 GHz, and 8 dB@8.1 GHz.

Figure 8:
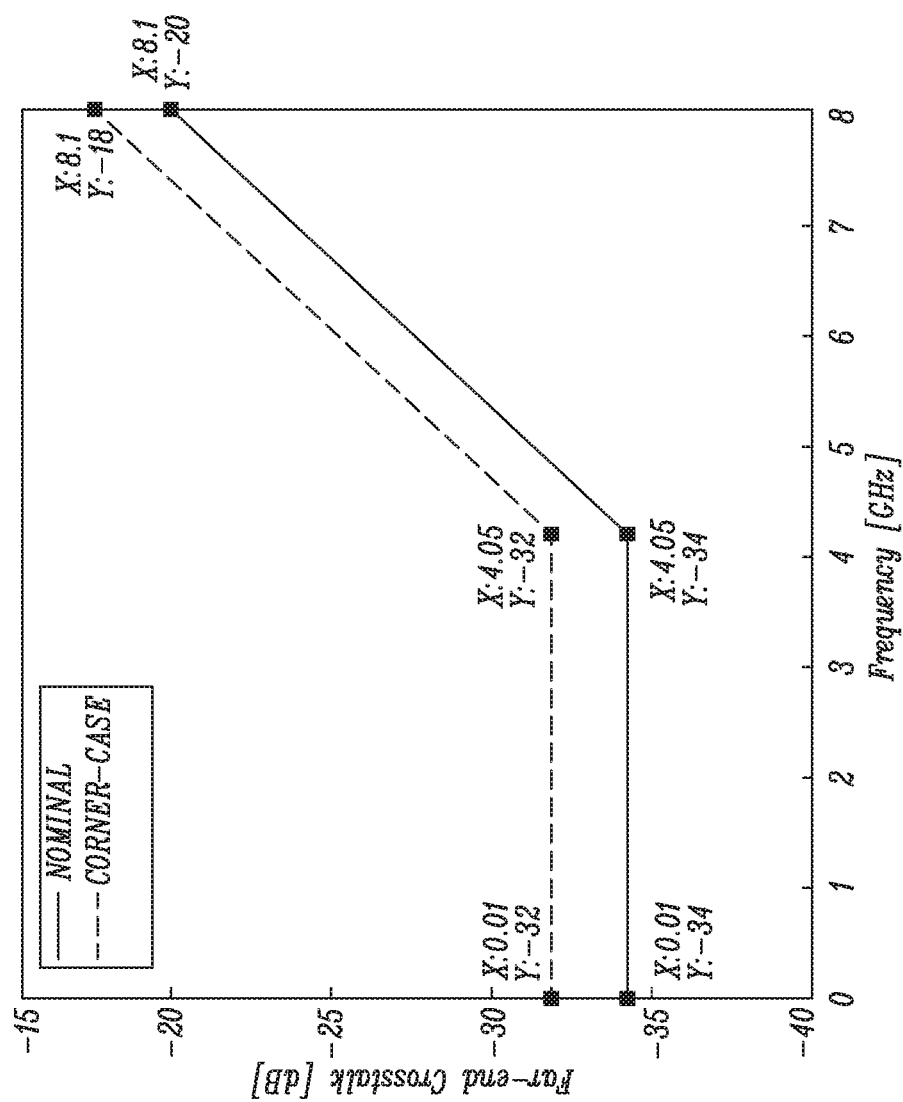
FIG. 8 is a plot of the maximum far-end crosstalk experienced by the high-speed pairs with reference normalized to 90-Ohm, differential, according to certain embodiments of the current disclosure.

In certain embodiments, each of the high-speed pairs meet or exceed the crosstalk requirements shown in FIG. 8, with reference normalized to 90-Ohm, differential. As shown in the FIG. 8, the far-end crosstalk at nominal state is no greater than 34 dB@0.01 GHz to 4.05 GHz, and 20 dB@8.1 GHz. Far-end crosstalk values at corner-case state are shown by dashed line in FIG. 8. The far-end crosstalk at corner-case state is no greater than 32 dB@0.01 GHz to 4.05 GHz, and 18 dB@8.1 GHz.

Figure 9:
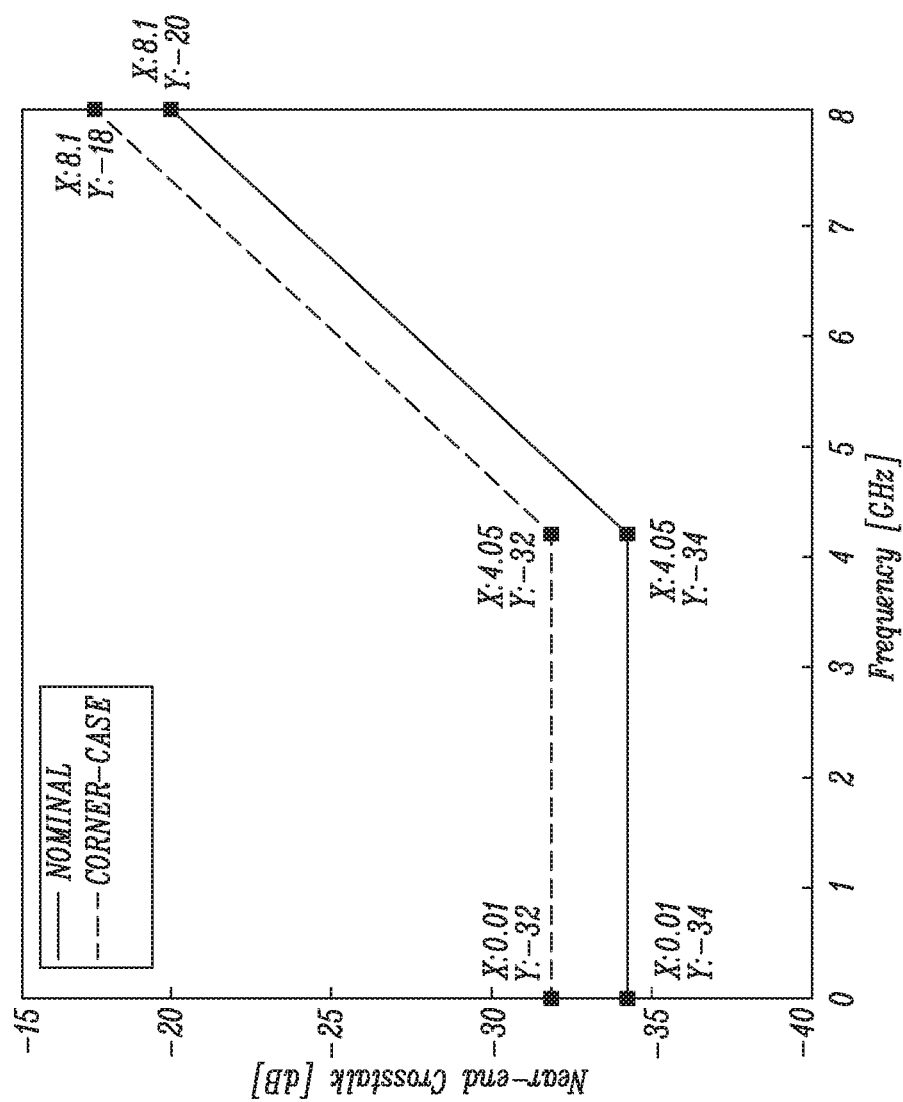
FIG. 9 is a plot of the maximum near-end crosstalk experienced by the high-speed pairs with reference normalized to 90-Ohm, differential, according to certain embodiments of the current disclosure.

In certain embodiments, each of the high-speed pairs meet or exceed the crosstalk requirements shown in FIG. 9, with reference normalized to 90-Ohm, differential. As shown in the FIG. 9, the near-end crosstalk at nominal state is no greater than 34 dB@0.01 GHz to 4.05 GHz, and 20 dB@8.1 GHz. Near-end crosstalk values at corner-case state are shown by dashed line in FIG. 9. The near-end crosstalk at corner-case state is 32 dB@0.01 GHz to 4.05 GHz, and 18 dB@8.1 GHz.

Figure 10:
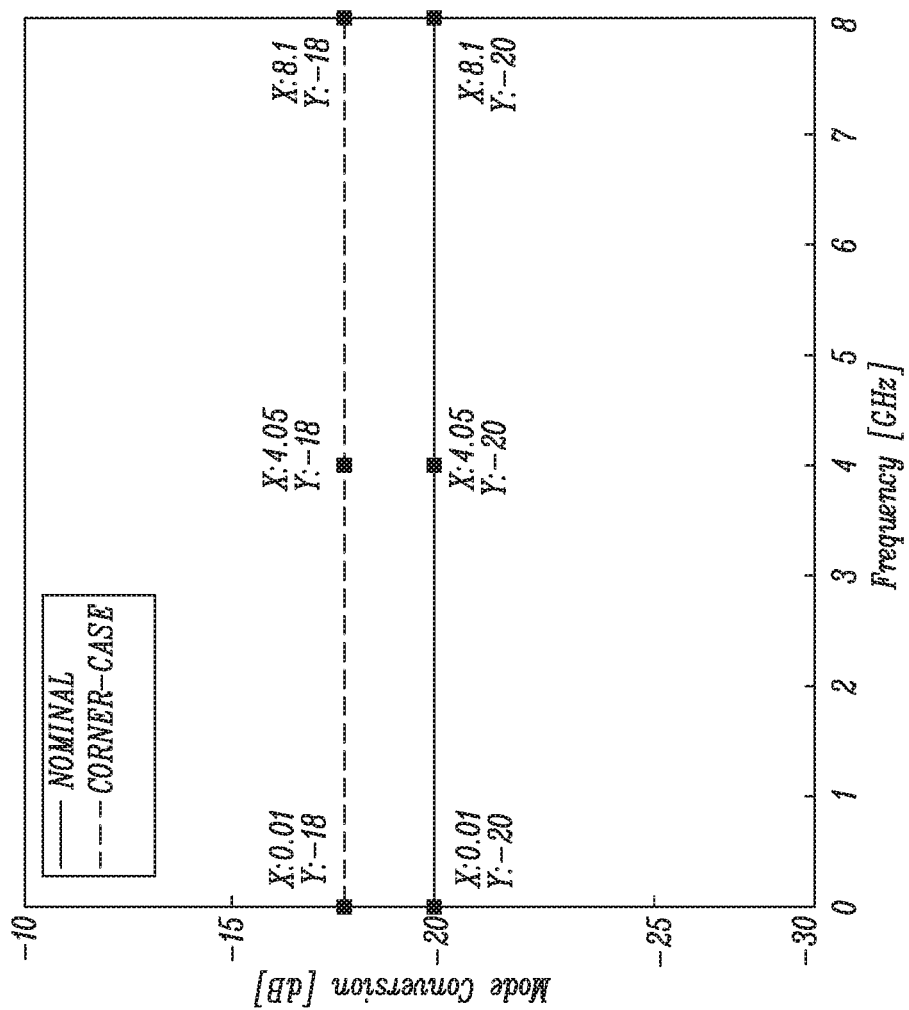
FIG. 10 is a plot illustrating mode conversion according to certain embodiments of the current disclosure.

In certain embodiments, for frequencies up to 8.1 GHz, mode conversion is bounded to −20 dB at nominal state and −18 dB at corner-case state as shown in FIG. 10. For micro-coaxial wire constructions, mode conversion is linearly proportional to intra-pair skews (i.e. length difference between P leg and N leg of a differential pair). Preferentially, unit length skew of 15 ps (i.e. 15 ps/meter) is aligned to −20 dB mode conversion.

Figure 11:
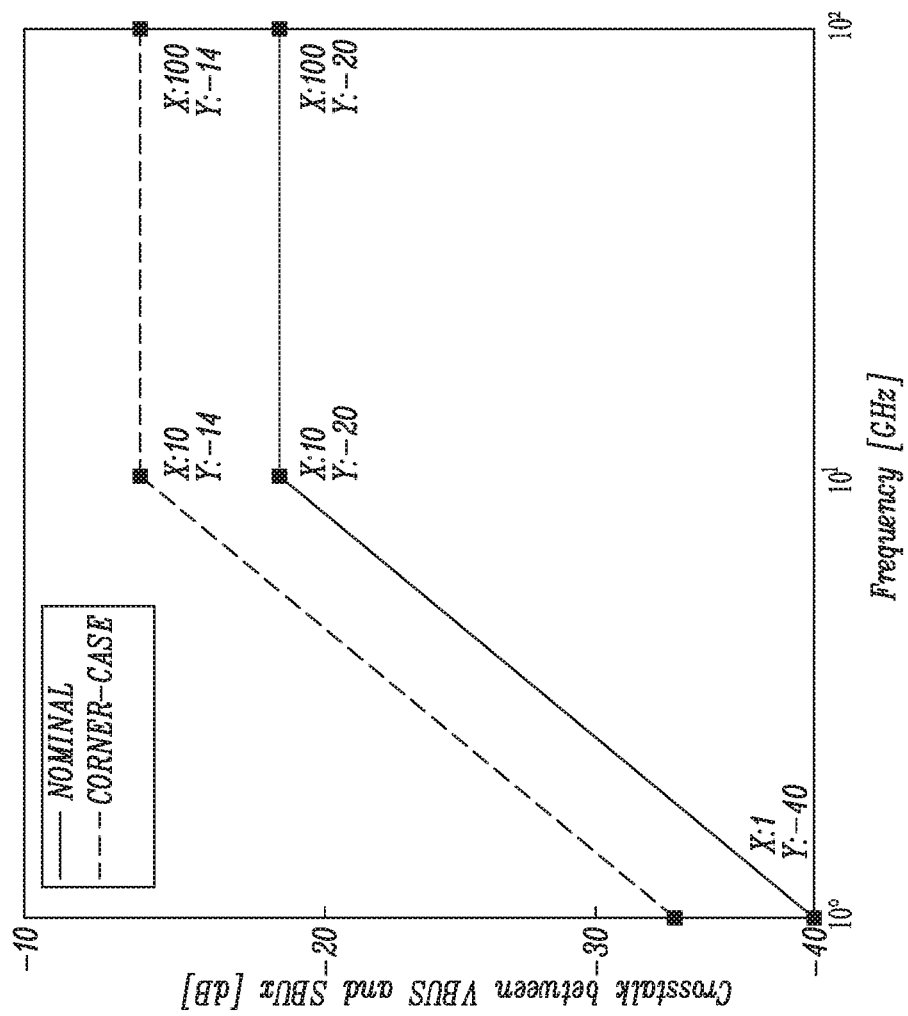
FIG. 11 is a plot of the maximum crosstalk between PWR and SBUx (x=1, and 2), according to certain embodiments of the current disclosure.

In certain embodiments, crosstalk between PWR and SBUx (x=1, and 2) meets the requirements shown in FIG. 11 to suppress power transient noise ingression to SBU signals in in-rush or load-release events. This limit applies to the differential crosstalk of all following cases, specifically, between PWR_TX and SBU1, between PWR_TX and SBU2, between PWR_RX and SBU1, between PWR_RX and SBU2, and between SBU1 and SBU2. At nominal state, the crosstalk is no greater than 40 dB@1 MHz and 20 dB for frequencies between 10 MHz to 100 MHz. At corner-case state, the crosstalk is no greater than 34 dB@1 MHz and 14 dB for frequencies between 10 MHz to 100 MHz Differential impedance for high-speed pairs may be 90 Ohm+/−5% both on the mated connector window and on cable bulk window. The rise time for TDR measurement may be 30 ps for 20% to 80%.

Figure 5:
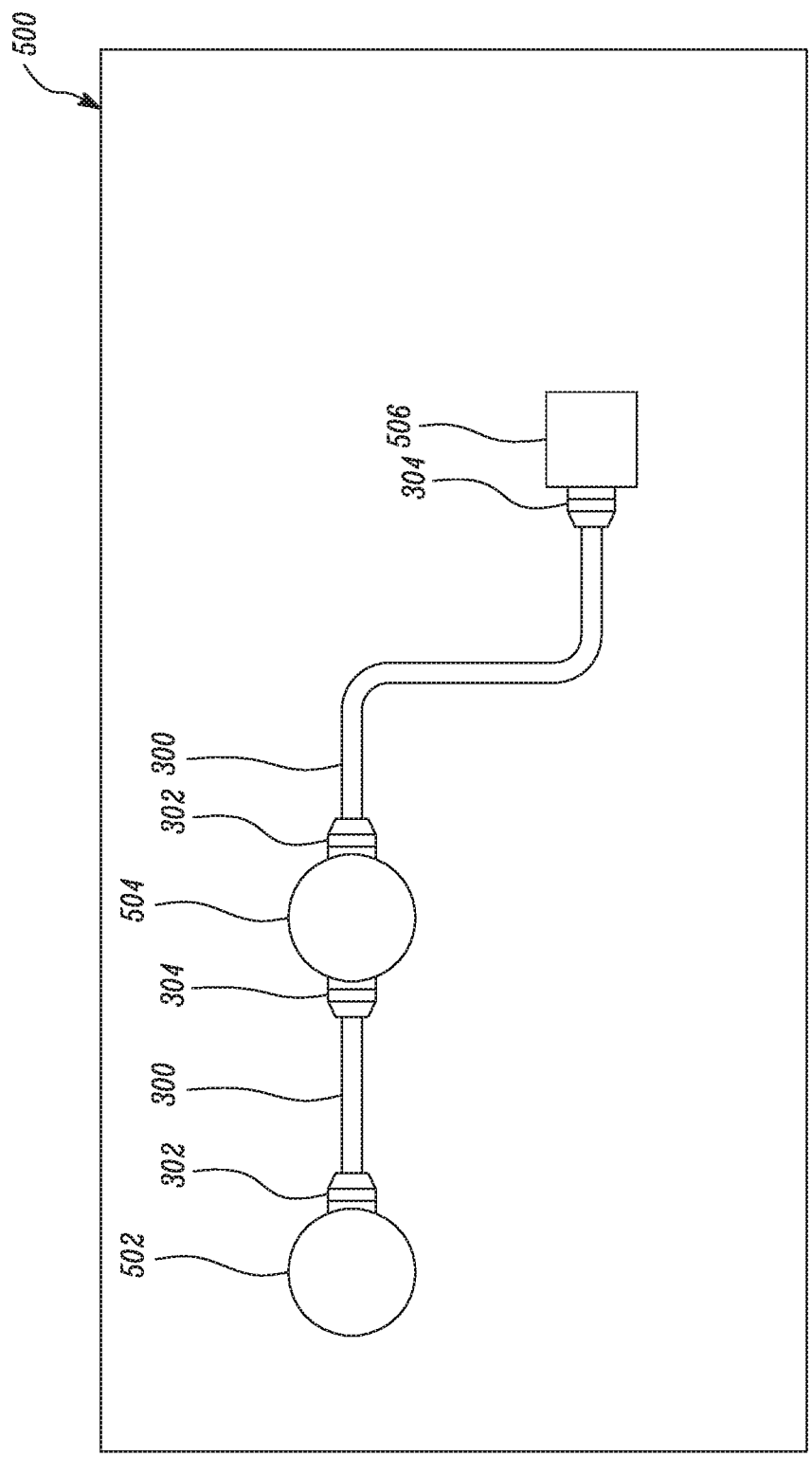
FIG. 5 illustrates an exemplary use of the cable to connect sensor components in an automobile according to certain embodiments of the current disclosure.

FIG. 5 illustrates an exemplary use of the cables to connect sensors within an automobile according to certain embodiments of the current disclosure. Cables 300 with connectors 302, 304 connect sensors 502, 504 to GPU/CPU 506 within automobile 500. The sensors 502, 504 may be connected to a GPU/CPU 506 using cables 300 with connectors 302, 304 by daisy chaining the sensors 502, 504 to one another and then to the GPU/CPU 506. Alternatively, the sensors 502, 504 may be directly connected to the GPU/CPU 506 without being daisy chained to other sensors 502, 504. The sensors 502, 504 may be optical or infrared cameras. Alternatively, they may be radar, LIDAR, ultrasonic sensors, another sensor, or another device.

The foregoing disclosure is not intended to limit the present disclosure to the precise forms or particular fields of use disclosed. As such, it is contemplated that various alternative embodiments and/or modifications to the present disclosure, whether explicitly described or implied herein, are possible in light of the disclosure. Having thus described embodiments of the present disclosure, a person of ordinary skill in the art will recognize that changes may be made in form and detail without departing from the scope of the present disclosure. For example, reference is made to "wire" or "wires," but a person of ordinary skill in the art will understand that in certain embodiments, one or more conductors (for example, metal without any insulation or outer sheathing) may be substituted. By way of another example, reference is made to "conductor" or "conductors," but a person of ordinary skill in the art will understand that in certain embodiments, one or more wires (such as, a metal conductor with insulation or an outer sheathing) may be substituted. Thus, the present disclosure is limited only by the claims.

In the foregoing specification, the disclosure has been described with reference to specific embodiments. However, as one skilled in the art will appreciate, various embodiments disclosed herein can be modified or otherwise implemented in various other ways without departing from the spirit and scope of the disclosure. Accordingly, this description is to be considered as illustrative and is for the purpose of teaching those skilled in the art the manner of making and using various embodiments of the disclosed cable assembly. It is to be understood that the forms of disclosure herein shown and described are to be taken as representative embodiments. Equivalent elements, or materials may be substituted for those representatively illustrated and described herein. Moreover, certain features of the disclosure may be utilized independently of the use of other features, all as would be apparent to one skilled in the art after having the benefit of this description of the disclosure. Expressions such as "including", "comprising", "incorporating", "consisting of", "have", "is" used to describe and claim the present disclosure are intended to be construed in a non-exclusive manner, namely allowing for items, components or elements not explicitly described also to be present. Reference to the singular is also to be construed to relate to the plural.

Further, various embodiments disclosed herein are to be taken in the illustrative and explanatory sense, and should in no way be construed as limiting of the present disclosure. All joinder references (e.g., attached, affixed, coupled, connected, and the like) are only used to aid the reader's understanding of the present disclosure, and may not create limitations, particularly as to the position, orientation, or use of the systems and/or methods disclosed herein. Therefore, joinder references, if any, are to be construed broadly. Moreover, such joinder references do not necessarily infer that two elements are directly connected to each other.

Additionally, all numerical terms, such as, but not limited to, "first", "second", "third", "primary", "secondary", "main" or any other ordinary and/or numerical terms, should also be taken only as identifiers, to assist the reader's understanding of the various elements, embodiments, variations and/or modifications of the present disclosure, and may not create any limitations, particularly as to the order, or preference, of any element, embodiment, variation and/or modification relative to, or over, another element, embodiment, variation and/or modification.

It will also be appreciated that one or more of the elements depicted in the drawings/figures can also be implemented in a more separated or integrated manner, or even removed or rendered as inoperable in certain cases, as is useful in accordance with a particular application.

What is claimed is:

1. A cable comprising:
a first layer comprising:
a plurality of differential conductors;
a plurality of drain conductors,
wherein the differential conductors and the drain conductors are arranged in the form of groups such that each group comprises a pair of differential conductors and a pair of drain conductors and defines a communication pathway for communicating signals;
a second layer comprising:
a plurality of secondary bus conductors;
a plurality of power conductors,
wherein the power conductors comprise at least two power domains, wherein each power domain is spatially apart and electrically isolated from each other power domain,
a plurality of ground conductors; and
a body formed around the plurality of differential conductors, the plurality of drain conductors, the plurality of secondary bus conductors, the plurality of power conductors, and the plurality of ground conductors.

2. The cable of claim 1, wherein the pair of drain conductors is located alongside the pair of differential conductors and enclosed together with the pair of differential conductors within a shield layer that is wrapped around the pair of drain conductors and the pair of differential conductors.

3. The cable of claim 2, wherein the shield layer is an Aluminum and Mylar film.

4. The cable of claim 3, wherein the shield layer is formed as a stack of Al-Mylar-Al.

5. The cable of claim 1, wherein the drain conductors and the differential conductors are collinear to one another.

6. The cable of claim 1, wherein the drain conductors and the differential conductors are separated by a repeatable pitch.

7. The cable of claim 1, wherein each pair of adjacently located drain conductors and differential conductors are arranged equidistant to one another.

8. The cable of claim 1, further comprising a first connector disposed on a proximal end of the body that is connected to at least one of the differential conductors, the drain conductors, the secondary bus conductors, the power conductors, and the ground conductors and a second connector disposed on a distal end of the body that is connected to at least one of the differential conductors, the drain conductors, the secondary bus conductors, the power conductors, and the ground conductors.

9. The cable of claim 8, wherein the first and second connectors have a plurality of pins themselves disposed therein.

10. The cable of claim 9, wherein the plurality of pins has a V shape or an open-triangle shape.

11. The cable of claim 9, wherein one or more pins are connected to the ground conductor and one or more pins are connected to a conductor capable of carrying high-speed data communications.

12. The cable of claim 8, wherein the first and second connectors have a plurality of thongs, pads, or sockets.

13. The cable of claim 8, wherein the connector includes pins connected to conductors for data transmission, pins connected to conductors for power transmission, and pins connected to conductors for use as a secondary bus.

14. The cable of claim 8, wherein the first and second connectors directly connect or daisy chain one or more sensors to a graphics processing unit (GPU) or a central processing unit (CPU), wherein the sensors are comprised of optical camera sensors, infrared camera sensors, light detection and ranging sensors (LIDAR), and ultrasonic sensors.

15. The cable of claim 1, wherein the communication pathway is capable of communicating signals in both the directions.

16. The cable of claim 1, wherein a thickness of the body is in the range of 0.1 millimeter to 10 centimeter.

17. The cable of claim 1, wherein at least one of the differential conductors and the drain conductors have an impedance of between 40 and 50 Ohms.

18. The cable of claim 1, wherein at least one of the differential conductors and the drain conductors have an impedance of between 80 and 90 Ohms.

19. The cable of claim 1, wherein the body is a dielectric.

20. The cable of claim 1, wherein the body is made of a thermoplastic polymer.

21. The cable of claim 1, wherein the body is made of a metal.

22. The cable of claim 1, wherein the body is formed through a lamination process.

23. A cable assembly comprising:
a top layer comprising a plurality of differential conductors and a plurality of drain conductors, wherein the differential conductors and the drain conductors are arranged in the form of groups such that each group comprises a pair of differential conductors and a pair of drain conductors and defines a communication pathway for communicating signals;
a bottom layer comprising a plurality of secondary bus conductors, a plurality of ground conductors and a plurality of power conductors,
wherein the power conductors comprise at least two power domains, wherein each power domain is spatially apart and electrically isolated from each other power domain; and
a body formed around the plurality of differential conductors, the plurality of drain conductors, the plurality of secondary bus conductors, the plurality of power conductors, and the plurality of ground conductors.

24. The cable assembly of claim 23, wherein the top layer is enclosed in a first outer jacket and the bottom layer is enclosed in a second outer jacket.

25. The cable assembly of claim 24, wherein the first outer jacket is seated on the second outer jacket.

26. The cable assembly of claim 23, wherein the pair of drain conductors is located alongside the pair of differential conductors and enclosed together with the pair of differential conductors within a shield layer that is wrapped around the pair of drain conductors and the pair of differential conductors.

27. The cable assembly of claim 26, wherein the shield layer is an Aluminum and Mylar film.

28. The cable assembly of claim 27, wherein the shield layer is formed as a stack of Al-Mylar-Al.

29. The cable assembly of claim 23, wherein the drain conductors and the differential conductors are collinear to one another.

30. The cable assembly of claim 23, wherein the drain conductors and the differential conductors are separated by a repeatable pitch.

31. The cable assembly of claim 23, wherein each pair of adjacently located drain conductors and differential conductors are arranged equidistant to one another.

32. The cable assembly of claim 23, further comprising a first connector disposed on a proximal end of the body that is connected to at least one of the differential conductors, the drain conductors, the secondary bus conductors, the power conductors, and the ground conductors and a second connector disposed on a distal end of the body that is connected to at least one of the differential conductors, the drain conductors, the secondary bus conductors, the power conductors, and the ground conductors.

33. The cable assembly of claim 32, wherein the first and second connectors have a plurality of pins themselves disposed therein.

34. The cable assembly of claim 33, wherein the plurality of pins has a V shape or an open-triangle shape.

35. The cable assembly of claim 33, wherein one or more pins are connected to the ground conductor and one or more pins are connected to a conductor capable of carrying high-speed data communications.

36. The cable assembly of claim 32, wherein the first and second connectors have a plurality of thongs, pads, or sockets.

37. The cable assembly of claim 32, wherein the connector includes pins connected to conductors for data transmission, pins connected to conductors for power transmission, and pins connected to conductors for use as a secondary bus.

38. The cable assembly of claim 23, wherein the communication pathway is capable of communicating signals in both the directions.

39. The cable assembly of claim 23, wherein a thickness of the body is in the range of 0.1 millimeter to 10 centimeter.

40. The cable assembly of claim 23, wherein at least one of the differential conductors and the drain conductors have an impedance of between 40 and 50 Ohms.

41. The cable assembly of claim 23, wherein at least one of the differential conductors and the drain conductors have an impedance of between 80 and 90 Ohms.

42. The cable assembly of claim 23, wherein the body is a dielectric.

43. The cable assembly of claim 23, wherein the body is made of a thermoplastic polymer.

44. The cable assembly of claim 23, wherein the body is made of a metal.

45. The cable assembly of claim 23, wherein the body is formed through a lamination process.

46. The cable assembly of claim 23, wherein the secondary bus conductors are capable of low-speed communication, wherein a positive and a negative conductor of the secondary bus conductors reference each other differentially.

47. The cable assembly of claim 46, wherein the positive and the negative conductor of the secondary bus conductors are comprised of AC common-mode components that are configured to conduct on the ground conductors.

48. The cable assembly of claim 23, wherein the secondary bus conductors and the ground conductors are arranged in-between the power conductors, wherein a physical buffer between the power domains is formed, and wherein one or more fault conditions of at least one power domain are less likely to affect at least one other power domain.

\* \* \* \* \*